United States Patent
Kawaguchi

[11] Patent Number: 6,071,323
[45] Date of Patent: Jun. 6, 2000

[54] ALLOY TARGET, ITS FABRICATION, AND REGENERATION PROCESSES

[75] Inventor: Yukio Kawaguchi, Yamanashi, Japan

[73] Assignee: TDKCorporation, Tokyo, Japan

[21] Appl. No.: 09/033,173

[22] Filed: Mar. 2, 1998

[30] Foreign Application Priority Data

Mar. 7, 1997 [JP] Japan ........................... 9-070612

[51] Int. Cl.⁷ ................................... C22C 33/02
[52] U.S. Cl. ................. 75/246; 75/245; 419/33; 419/48
[58] Field of Search ................ 75/245, 246; 419/48, 419/33

[56] References Cited

U.S. PATENT DOCUMENTS

| | | | |
|---|---|---|---|
| 4,915,737 | 4/1990 | Morimoto et al. | 75/246 |
| 4,915,738 | 4/1990 | Morimoto et al. | 75/246 |
| 4,946,501 | 8/1990 | Nate et al. | 75/246 |
| 4,992,095 | 2/1991 | Nate et al. | 75/246 |
| 5,062,885 | 11/1991 | Matsumoto et al. | 75/255 |
| 5,282,946 | 2/1994 | Kinoshita et al. | 204/298.13 |
| 5,338,331 | 8/1994 | Hijikata et al. | 75/246 |
| 5,439,500 | 8/1995 | Marx | 75/246 |
| 5,447,801 | 9/1995 | Masuda et al. | 428/567 |
| 5,607,780 | 3/1997 | Masuda et al. | 428/694 ML |
| 5,710,384 | 1/1998 | Masuda | 75/246 |

FOREIGN PATENT DOCUMENTS

| | | |
|---|---|---|
| 63-28985 | 6/1988 | Japan . |
| 1-15591 | 3/1989 | Japan . |
| 3-54189 | 8/1991 | Japan . |
| 3-55547 | 8/1991 | Japan . |
| 3-55548 | 8/1991 | Japan . |
| 3-72153 | 11/1991 | Japan . |
| 4-59075 | 9/1992 | Japan . |
| 5-48281 | 7/1993 | Japan . |
| 5-49730 | 7/1993 | Japan . |
| 6-26171 | 4/1994 | Japan . |

*Primary Examiner*—Ngoclan Mai
*Attorney, Agent, or Firm*—Laubscher & Laubscher; R. J. Lasker, Esq.

[57] ABSTRACT

An alloy target comprises at least one rare earth metal element Tb, Dy, Gd, Sm, Nd, Ho, Tm, and Er with a substantial balance of a transition metal element such as Fe, Co and Ni, and has a substantially homogeneous sintered structure and a permeability of 3 or lower. The alloy target is fabricated by a process comprising steps of melting in a high-frequency furnace or crucible furnace, quenching, pulverization, and firing under pressure. After the alloy target has been used up, it is regenerated by mixing alloy powders (to be regenerated) obtained by the mechanical pulverization of the used-up target with the alloy powders obtained at the pulverization step of the aforesaid process to obtain a mixture, and firing the mixture under pressure.

9 Claims, 2 Drawing Sheets

ALLOY TARGET, ITS FABRICATION, AND REGENERATION PROCESSES

BACKGROUND OF THE INVENTION

The present invention relates to a sputtering target used as a magneto-optical recording material and made up of a rare earth metal-transition metal alloy as well as its fabrication, and regeneration processes.

An amorphous material made up of a rare earth metal-transition metal alloy such as Tb—Fe—Co is preferably used for a recording layer of a magneto-optical recording medium. Such a recording layer is usually formed by a magnetron sputtering technique. In the magnetron sputtering technique, it is required to leak a magnetic flux from a magnetic field generating means located on the back side of a target through the target out to the surface side of the target. When the permeability of the target is high, it is thus impossible to obtain sufficient magnetic field strength due to a leakage magnetic flux because the magnetic flux passing through the target increases. When a high-permeability target is used, therefore, it is required to make sure of a leakage magnetic flux by reducing the thickness of the target.

However, the thinner the target, the shorter the sputtering enabling time per target is. For this reason, the operation for opening a sputtering chamber for a target replacement and again drawing a vacuum therein must be frequently effected, resulting in productivity drops and, hence, some added cost. When a target product is produced by sintering, it is required to polish off an oxidized region in the vicinity of the surface of the product after sintering. The amount of the oxidized region to be polished is about 1 mm irrespective of target thickness; the thinner the target, the greater is the amount of the region making no contribution to sputtering and so rejected, again resulting in some added cost.

Regarding the target for forming a recording layer of magneto-optical recording media and its production process, for instance, some proposals have been made, as mentioned below.

(i) JP-B 64-2177 discloses a process of producing an alloy target material by melting a rare earth metal and a transition metal in an arc melting furnace into an alloy ingot, pulverizing the alloy ingot, and hot pressing the obtained alloy powders. Therein, the alloy ingot is subjected to wet fine grinding in an organic solvent. However, since the final powder particle size is as fine as 1 to 10 μm as expressed by the mean particle diameter, the powders degrade with the progress of their oxidation. Therein, it is stated that the alloy ingot is produced by arc melting. In the arc melting, however, the raw material powders are melted by arc scanning, and so the molten metal is gradually cooled after passing through the arc, resulting in the precipitation of Fe. It is thus impossible to make the target thick due to its high permeability, resulting in a decrease in the service life per target. In the examples, targets of 1.2 to 1.3 mm in thickness are fabricated.

(ii) JP-B 1-19448 discloses a process of producing a target material comprising a mixed structure of an intermetallic compound of a rare earth metal with an iron group metal and a pure iron group metal by mixing the rare earth metal in a finely divided form with the iron group metal in a finely divided form, hot forming the obtained mixture at a temperature below the temperature at which a metal component system therein can be present as a liquid phase, thereby forming a dense compact, and heating the compact for a short period of time at a temperature higher than the temperature at which the metal component system in the compact can be present as a liquid phase. This target material contains 30 to 50% by weight of the rare earth metal with the balance being the iron group metal. Therein, it is alleged that the invention has the advantage of providing a high-strength target material for sputtering, which can form a magneto-optical recording medium having a stable composition and a low oxygen concentration.

However, the target material set forth in the aforesaid publication has a high permeability due to the presence of a phase comprising the pure iron group metal. It is thus impossible to make the target material thick, resulting in a decrease in the service life per target. In the examples, any target material having a thickness exceeding 2 mm is not fabricated at all. According to the process disclosed therein, it is required to pulverize the rare earth metal. However, the rare earth element has a ductility too high for pulverization, and so is likely to entrain oxygen therein upon pulverization. In the examples, indeed, the target material contains oxygen in not a little amount of, say, 1.5 at % or more.

(iii) JP-B 2-48623 discloses an alloy target comprising 10 to 50 at % of a rare earth metal with the balance being substantially a transition metal, and having a mixed structure comprising at least three phases, each being an intermetallic compound of the rare earth metal with the transition metal. This alloy target is fabricated by the sintering of alloy powders produced by a reducing diffusion technique. Therein, it is alleged that the invention can provide an alloy target having the advantages of being less likely to crack, having a dense and homogeneous composition and a sufficiently decreased oxygen content, being inexpensive, etc.

However, the presence of the three phases is tantamount to the presence of a phase having a higher transition metal concentration. The phase having a higher transition metal concentration, because of having a high permeability, renders it impossible to make a thick target, resulting a decrease in the service life per target. In the aforesaid publication, the ratio between the three phases is not directly disclosed. From the examples that do not show targets having a thickness exceeding 4.5 mm, however, it is believed that all the targets have a high permeability. Also, it is disclosed that the target is fabricated by producing an alloy powder comprising a single transition metal phase and an intermetallic compound surrounding and covering the same by the reducing diffusion technique, and sintering the alloy powder. With this process, it is difficult to cut down the cost of the raw material because it is impossible to recycle used-up targets by pulverization.

(iv) JP-B 3-6218 discloses a sintered composite target material comprising a rare earth metal grain, a transition metal grain, and a reaction diffusion layer of both. Therein, it is alleged that the advantages of the target material are large flexural strength, good impact resistance, low oxygen contents, and high sputtering rates.

However, the sintered composite target material set forth in the aforesaid publication, because of containing much transition metal grains, has an increased permeability. This renders it impossible to make the target material thick, resulting in a decrease in the service life per target. In the examples, indeed, any target material having a thickness exceeding 5 mm is not fabricated at all. In the production process set forth therein, the rare earth metal need be pulverized into rare earth metal particles used as the raw material. However, the rare earth metal has a ductility too high for pulverization, and so is likely to entrain oxygen therein upon pulverization.

(v) JP-B 3-54189 discloses a process of regenerating a used-up target by the filling-up of asperities on the surface of the target, which have been formed upon use with a magnetron sputtering system. Specifically, the asperities are filled up with supplementing powders composed of the same material as the target material. Then, the target is subjected to hot hydrostatic pressing or hot forging thereby forming a compact packed with the supplementing powders at high density. Subsequently, the target is heat treated to bond the target material firmly to the compact through diffusion. The thus regenerated target material is built up of a used-up target material portion, a powder compact portion and a diffusion bonded portion at a boundary therebetween. Therein, it is alleged that the regenerated target material has generally the same quality as a fresh target material.

However, the process set forth in the aforesaid publication is actually susceptible to a sputtered film composition variation ascribable to a composition variation of each portion.

One object of the invention is to decrease the permeability of an alloy target, which comprises a rare earth metal-transition metal alloy. Another object of the invention is to decrease the oxygen content of such an alloy target. Yet another object of the invention is to provide easy regeneration of an alloy target after it has been used up.

SUMMARY OF THE INVENTION

Such objects are achieved by any one of (1) to (9) as mentioned below:

(1) An alloy target used to form a magneto-optical recording layer by a magnetron sputtering technique, which comprises 20 to 30 at % of at least one rare earth metal element selected from the group consisting of terbium, dysprosium, gadolinium, samarium, neodymium, holmium, thulium and erbium with a substantial balance of a transition metal element necessarily including at least one element selected from the group consisting of iron, cobalt and nickel, and has a substantially homogeneous sintered structure and a permeability of up to 3.

(2) The alloy target according to (1), wherein said transition metal element further includes chromium.

(3) The alloy target according to (1), which is in a sheet form having a thickness of at least 8 mm.

(4) The alloy target according to (1), which has an oxygen content of up to 1,000 ppm.

(5) The alloy target according to (1), wherein an $Fe_3Tb$ type crystal phase accounts for at least 90% of all crystal phases.

(6) A process of fabricating an alloy target as recited in (1), which comprises steps of:

blending together said rare earth metal element and said transition metal element in such a way that R/(R+T)=20 to 30 at % where R is said rare earth metal element and T is said transition metal element, thereby obtaining a blend, melting said blend in a high-frequency furnace or crucible furnace to obtain a melt and then quenching said melt to obtain a quenched alloy, mechanically pulverizing said quenched alloy in a non-oxidizing atmosphere to obtain alloy powders, and firing under pressure said alloy powders in an inert gas atmosphere or in vacuum, thereby sintering said alloy powders.

(7) The process according to (6), wherein at least 90% by weight of said alloy powders has a particle diameter of 45 to 425 μm.

(8) A process of regenerating an alloy target as recited in (1) after said alloy target has been used up, which comprises:

a first stage of mechanically pulverizing said used-up alloy target in a non-oxidizing atmosphere to obtain alloy powders to be regenerated, a second stage comprising steps of blending together said rare earth metal element and said transition metal element to obtain a blend, melting said blend in a high-frequency furnace or crucible furnace to obtain a melt and then quenching said melt to obtain an quenched alloy, and mechanically pulverizing said quenched alloy in a non- oxidizing atmosphere to obtain alloy powders, and a third stage comprising steps of mixing said alloy powders obtained at said second stage with said alloy powders obtained at said first stage to obtain a mixture and firing under pressure said mixture in an inert gas atmosphere or in vacuum thereby sintering said mixture.

(9) The process according to (8), wherein R/(R+T) in said blend obtained at said second stage is larger than R/(R+T) in said alloy powders obtained at said first stage by a factor of 1.02 to 1.08, where R is said rare earth metal element and T is said transition metal element.

BRIEF DESCRIPTION OF THE DRAWINGS

The above and other objects, features, and advantages of the invention will be better understood from the following description taken in conjunction with the accompanying drawings, in which.

DETAILED DESCRIPTION OF THE INVENTION

Figure 1:
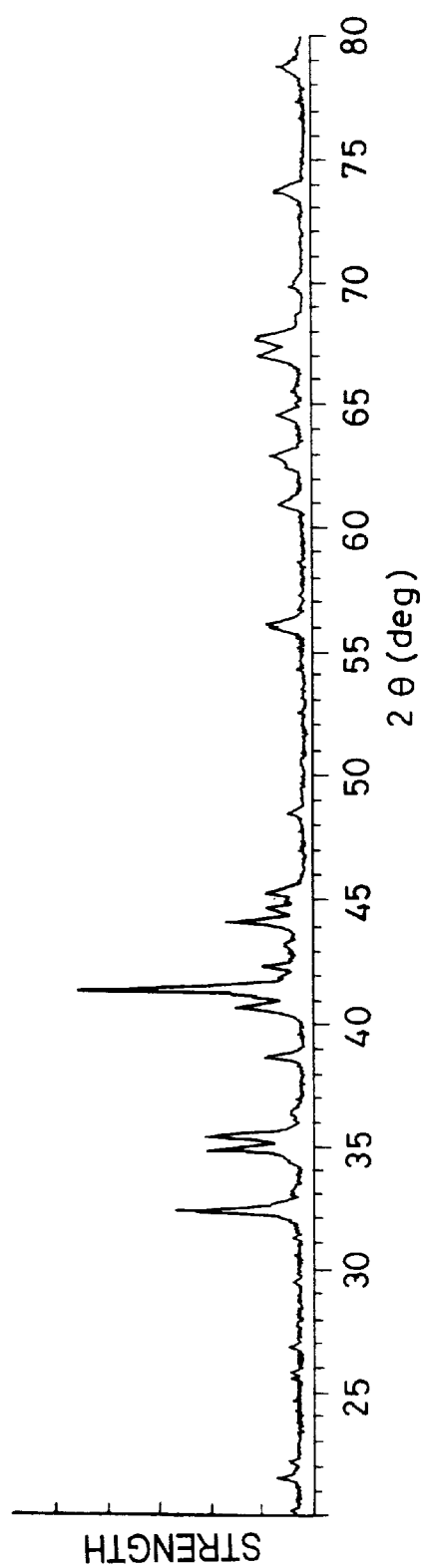
FIG. 1 is an X-ray diffraction chart for a target.

According to the present invention, the rare earth metal and transition metal are formed by high-frequency melting into a molten metal, which is in turn quenched and pulverized to obtain alloy powders. The alloy powders are then fired under pressure, thereby sintering the powders into a target. Since, in the invention, the high-frequency furnace or crucible furnace is used for the melting of the rare earth metal and transition metal, the precipitation of the transition metal alone is not substantially observed unlike a conventional process relying upon arc melting. Also, the precipitation or growth of a transition metal phase is not substantially found because of using quenching for alloying. For these reasons, the target of the invention has a single sintered structure composed of a rare earth metal-transition metal system, and so has a decreased permeability.

According to the invention, a target having a reduced oxygen content can be achieved because the quenched alloy is pulverized into large particles less likely to entrain oxygen therein.

By an appropriate choice of conditions for firing under pressure, it is possible to reduce increases in the permeability and oxygen content due to firing and increase the density upon sintering and, hence, achieve a target having a reduced permeability and a reduced oxygen content and less likely to crack.

According to the instant process of regenerating an alloy target after it has been used up, the used-up alloy target is first pulverized to obtain alloy powders to be regenerated. The alloy powders to be regenerated are then fed to the process of fabricating a target according to the invention, where they are mixed with new alloy powders obtained by the pulverization of the quenched alloy. Subsequently, the mixture is fired under pressure through the aforesaid steps, thereby obtaining a regenerated target. Since the target of the invention comprises a substantially homogeneous sintered structure, the alloy powders obtained by the pulverization of the used-up target has substantially the same structure as the newly prepared alloy powders. For this reason, the used-up target can be easily regenerated with little or no deterioration or change of its properties.

Some preferred embodiments of the invention will now be explained at great length.

Target

The target of the invention is used for the formation of a magneto-optical recording material by a magnetron sputtering technique.

The target of the invention comprises at least one rare earth metal element selected from the group consisting of terbium or Tb, dysprosium or Dy, gadolinium or Gd, samarium or Sm, neodymium or Nd, holmium or Ho, thulium or Tm and erbium or Er in an amount of 20 to 30 at %, and preferably 20 to 26 at %. The balance is substantially a transition metal element that necessarily includes at least one of iron or Fe, cobalt or Co and nickel or Ni. Too much rare earth metal results in a target material less likely to be pulverized and so likely to be oxidized in the production process. Such a target material cannot be used to produce a magneto-optical recording layer having good properties. Too little rare earth metal again makes it impossible to obtain a magneto-optical recording material having good properties. In addition, the proportion of the transition metal is increased, resulting in a permeability increase.

The proportion of Fe+Co+Ni in the transition metal elements is preferably at least 85 at %, and more preferably at least 90 at %. When this proportion is too low, it is impossible to obtain a magneto-optical recording material having good properties. The proportion of Fe in the transition metal elements is preferably at least 80 at %. When this proportion is too low, it is again impossible to obtain a magneto-optical recording material having good properties. A preferred transition metal element other than Fe, Co and Ni is chromium or Cr. Since Cr is effective for improvements in corrosion resistance and the capability of being pulverized, it is preferable to use as the transition metal elements Fe, Co and Ni plus Cr.

The target of the invention, for instance, may additionally contain as inevitable impurities at least one of aluminum or Al, silicon or Si, calcium or Ca, magnesium or Mg, carbon or C, sulfur or S, etc. Preferably in this case, the total amount of these elements is up to 0.1 at %.

The target of the invention is a sintered body that is substantially free of both a rare earth metal phase and a transition metal phase, and has a single structure consisting of crystal grains of the rare earth metal-transition metal alloy.

The rare earth metal-transition metal alloy forming the target comprises an $Fe_3Tb$ type crystal phase as a major phase and usually an $Fe_{23}Tb_6$ or $Fe_2Tb$ type crystal phase as a subordinate phase. The $Fe_{23}Tb_6$ type crystal phase appears generally when the Tb content is relatively small or $\geq$ about 25 at %, and the $Fe_2Tb$ type crystal phase appears generally when the Tb content is relatively large or $\geq$ about 25 at %.

The $Fe_3Tb$ type crystal phase accounts for preferably at least 88% by volume, more preferably at least 92% by volume, of all the crystal phases. Observation of a section through the target under a scanning electron microscope indicates that there is a crystal structure wherein the $Fe_{23}Tb_6$ or $Fe_2Tb$ type crystal phases are dispersed in a matrix phase composed of the $Fe_3Tb$ type crystal phase. These phases may be identified and quantitatively determined by X-ray diffractometry, and EPMA (electron probe microanalysis) of a section through the target. X-ray diffractometry shows that any crystal phase is not substantially found with the exception of the aforesaid $Fe_3Tb$, $Fe_{23}Tb_6$ and $Fe_2Tb$ type crystal phases.

From the results of EPMA, it is believed that the Fe sites in each of the aforesaid crystal phases have been replaced by Co, Ni and Cr contained in the target.

Preferably, the target of the invention should be free of an α-Fe phase as investigated by X-ray diffractometry.

In the practice of the invention, firing is preferably carried out at such a temperature that no grain growth takes place, as will be described later. Accordingly, the mean grain diameter of the target is a reflex of the diameter of the alloy powder used as the raw material.

It should here be noted that little or no grain boundary is present in the target of the invention.

The target of the invention has a permeability of up to 3, and preferably up to 2.5. When the target has too high a permeability, its thickness cannot be increased because of a decrease in the magnetic flux leaking out of the surface of the target during magnetron sputtering. As a result, the productivity of magneto-optical recording media drops as already mentioned. Currently available targets have a permeability of at least about 5 whereas the target of the invention has a permeability of at most 3. Even when the target of the invention is at least twice as thick as a conventional target, therefore, equal or higher magnetic field strength is available on the target during magnetron sputtering.

It should here be noted that the target of the invention has a permeability of 1 or more, and usually 1.5 or more.

The target of the invention is available in a sheet form, and is not critical in terms of thickness. However, the target of the invention can be increased in thickness because of its decreased permeability. For instance, even at a thickness of 8 mm or more an increased leakage flux strength is available on the target during magnetron sputtering, and yet even at a thickness of 10 mm or more satisfactory leakage flux strength is available. To obtain adequate leakage flux strength, however, it is preferable to bring the thickness of the target down to 12 mm or lower. The target of the invention may be in a suitable plane form, for instance, in a circular, oval or rectangular form. The major or minor diameter of the target may usually be of the order of 120 to 260 mm.

The target of the invention is less likely to entrain oxygen therein in the production process because it is produced by the process to be described later. For this reason, the oxygen content of the target can be easily reduced to 1,000 ppm or lower and, in some cases, 600 ppm or lower.

The density of the target upon sintering is preferably at least 95%, and more preferably at least 98%. According to the process to be described later, such a high density upon sintering can be easily obtained. The target of the invention has a high density upon sintering and, hence, adequate mechanical strength; it is less likely to crack at a target bonding step of mounting the target on a sputtering system. By the term "density upon sintering" used herein is intended the ratio of the density of a sintered body to theoretic density.

Target Production Process

In what follows, the process of producing the target of the invention will be explained.

Alloying Step

In the first place, the rare earth metal and transition metal are blended together such at a ratio that the aforesaid target composition is obtained.

Then, the blend is melted in a high-frequency furnace or crucible furnace (reverberatory furnace). In the practice of the invention, the high-frequency furnace is preferred. While metals are placed in a coil in the high-frequency furnace, high-frequency currents are passed through the coil to create an eddy current in the metals. The metals are then melted by electrical resistance heating into a molten metal. With the aforesaid arc melting technique, on the other hand, it is impossible to melt metals thoroughly into a molten metal because the metals are heated by arc scanning. With high-frequency melting, metals can be thoroughly melted into a molten metal which can be quenched while spontaneously stirred, thereby obtaining a homogeneous alloy with little precipitation of foreign phases. With the crucible furnace, it is possible to obtain a homogeneous alloy close to that obtained in the high-frequency furnace because metals are overall heated by a heater. The melting of metals in the high-frequency furnace or crucible furnace takes place in a non-oxidizing atmosphere such a nitrogen or argon gas atmosphere.

Next, the molten metal is quenched. For this purpose, for instance, use may be made of a casting technique or spraying techniques (e.g., a gas atomization technique, a single roll technique, and a centrifugal disk technique), among which the casting technique is preferred because of ease with which cost reductions are achievable. According to the casting technique, a molten metal is cast in a ceramic crucible that is opened at an upper portion and capable of being cooled, a horizontal split die or a vertical split die, wherein it is quenched. Preferably, a thin sheet of the order of 10 to 50 mm is present in the internal space of the crucible or split die. Preferably, quenching takes place at such a high rate that castings cannot maintain the form of a thin sheet due to their cracking.

Quenching is carried out in a non-oxidizing atmosphere such as a nitrogen or argon gas atmosphere. In the invention, the molten metal is quenched into an alloy. Thus, an alloy having a very low permeability can be obtained with neither formation nor growth of an α-Fe phase.

To reduce the oxygen content of the quenched alloy, it is preferable to polish off an oxygen-enriched region present on the surface of the quenched alloy. A polishing depth of about 1 mm or less from the alloy surface is sufficient for the practice of the invention.

Pulverization Step

Subsequently, the quenched alloy is mechanically pulverized into alloy powders. Pulverization is carried out in a non-oxidizing atmosphere such as a nitrogen or argon gas atmosphere, and in such a way that alloy powders having a particle size of preferably 45 to 425 μm, and preferably 100 to 200 μm, account for at least 90% by weight, and preferably at least 95% by weight, of all the alloy powders. Alloy powders having too small a particle size are oxidized during pulverization, resulting in a target having too much oxygen. On the other hand, alloy powders having too large a particle size are less likely to be sintered. Thus, these powders must be fired at an elevated temperature at the firing step to be described later. However, this is not preferable because the permeability of the resulting target material becomes high due to the precipitation of an α-Fe phase. Pulverizing means suitably, but not exclusively, used in the practice of the invention, include coarse grinding mills such as jaw crushers, roll crushers, cone crushers, hammer mills, and stamp mills, and fine grinding mills such as disk mills, Brownian mills, ball mills, attritors, and jet mills. After pulverization, the powders may be classified through a sieve or the like, if required.

Firing Step

Finally, the alloy powders are fired under pressure in an argon or other inert gas atmosphere or in vacuum to obtain a sintered compact. The firing under pressure is preferably carried out by hot pressing or hot hydrostatic pressing. The pressure and temperature applied to the firing under pressure may be determined such that a dense sintered compact can be obtained while the formation and growth of an α-Fe phase are inhibited. Also, the firing is preferably carried out at a temperature at which no liquid phase sintering takes place. Further, the firing is preferably carried out at a temperature at which no grain growth occurs from the purpose of preventing the target from cracking.

Specifically, when hot pressing is used, a pressure of 400 kgf/cm$^2$ or higher is preferably applied at a firing temperature of preferably 900 to 1,200° C. The alloy powders are held at that firing temperature for a period of time of preferably 5 to 60 minutes, and the rate of heating them to the firing temperature is preferably at least 10° C./min. When hot hydrostatic pressing is employed, a pressure of 500 kgf/cm$^2$ or higher is preferably applied at a firing temperature of preferably 600 to 1,000° C. The alloy powders are held at that firing temperature for a period of time of preferably 20 to 60 minutes, and the rate of heating them to the firing temperature is preferably at least 20° C./min. Too low a firing pressure results in a decrease in the density of the target upon sintering. When it is intended to make sure of the density of the target upon sintering by excessively elevating the firing temperature, the oxygen content of the target becomes high, with an increase in the permeability of the target due to the precipitation of an α-Fe phase. When the firing temperature is too low, on the other hand, the density of the target upon sintering becomes low, and so the mechanical strength of the target becomes insufficient. If the heating rate and firing time are within the aforesaid ranges, the target is less likely to crack due to an increase in the density of the target upon sintering. While no upper limit is imposed on the firing pressure, it is understood that when a general carbon mold is used as a molding box in the hot pressing process, a firing pressure of 600 kgf/cm$^2$ or lower is preferably used. On the other hand, a firing pressure of 2,000 kgf/cm$^2$ or lower is preferably applied to hot hydrostatic pressing.

When the firing under pressure is carried out, it is preferable that the alloy powders are pressurized, then heated, then held at the firing temperature for a given time, and finally cooled upon depressurization.

After firing, a compositionally and structurally inhomogeneous region present in the vicinity of the surface of the sintered compact is polished off to finish up a sputtering target. A polishing depth of about 1 mm or less is then sufficient for the practice of the invention.

Regeneration of Target

The process of regenerating a used-up target according to the invention will now be explained.

In the first place, the bonding material is removed from the used-up target material to obtain the target in its entirety.

Pulverization Step

Next, the thus obtained target is pulverized into alloy powders. Hereinafter, these alloy powders will be called the alloy powders to be regenerated. The pulverization may be carried out as in the case of the pulverization step used for target production. That is, the pulverization atmosphere used, the preferable particle diameter range, and other conditions are similar to those for the pulverization step used for target production.

Mixing Step

Then, the alloy powders to be regenerated are mixed with alloy powders obtained at the pulverization step for target production (which will hereinafter be referred to as the new alloy powders), thereby obtaining a mixture. Although the mixing ratio of the alloy powders to be regenerated with respect to the new alloy powders is not critical in the practice of the invention, it is usually preferable that the new alloy powders account for 10 to 80 parts by weight of the mixture. In this connection, it should be noted that the alloy powders to be regenerated are higher than the new alloy powders in terms of the degree of oxidization of the rare earth metal. Thus, too high a proportion of the alloy powders to be regenerated is not preferable because the properties of the target to be regenerated become inadequate. To reduce the influence by oxidation of the alloy powders to be regenerated, it is preferable that the proportion of the rare earth metal in the new alloy powders is higher than that in the objective composition of the target. Specifically, the ratio R/(R+T) in the new alloy powders is preferably larger than the ratio (R/(R+T) in the alloy powders to be regenerated by a factor of 1.02 to 1.08 where R is the rare earth metal element(s) and T is the transition metal element(s).

Firing Step

The mixture is then fired under pressure to obtain a sintered compact. Preferable conditions for this firing under pressure are similar to those at the firing step used for target production. Finally, the surface of the sintered compact is polished off to finish up a regenerated target.

EXAMPLE

Examples of the invention are given below by way of illustration and not by way of limitation.

Example 1

Twenty-five (25) at % Tb, 65 at % Fe, 5 at % Co and 5 at % Cr were blended together to prepare 2 kg of raw material in total. The raw material was melted in a high-frequency furnace, and the melt was then cast in a ceramic mold having a plane size of 200 mm×200 mm where it was quenched to obtain a quenched alloy. High-frequency melting and quenching were carried out in a nitrogen gas flow atmosphere.

Then, a surface region of the quenched alloy was polished off to a depth of 0.5 mm. As a result, the oxygen content throughout the quenched alloy was reduced to 200 ppm or lower.

Subsequently, the quenched alloy was reduced to a diameter of 3 mm or less in a stamp mill, and then fed into a 0.4 mm gap between WC rotating disks in a disk mill to obtain alloy powders having a particle diameter of 10 to 500 μm. The alloy powders were classified through a 45 μm opening sieve and a 425 μm opening sieve. Size reduction and pulverization were carried out in a nitrogen gas flow atmosphere.

The size distribution of the alloy powders, as measured, is shown in Table 1 together with the corresponding amounts of oxygen and Tb.

TABLE 1

| Particle Size (μm) | Proportion (wt %) | Oxygen (ppm) | Tb (at %) |
|---|---|---|---|
| >425 | 1.0 | 100 | 24.961 |
| >250 | 20.6 | 200 | 24.982 |
| >150 | 22.8 | 200 | 25.001 |
| >106 | 20.3 | 200 | 24.977 |
| >75 | 13.8 | 200 | 24.993 |
| >63 | 12.5 | 250 | 24.972 |
| >45 | 5.0 | 300 | 24.967 |
| ≦45 | 4.0 | 600 | 24.960 |

From Table 1, it is found that the Tb content of the alloy powders is not dependent on their particle size, and is very invariable. It is also found that alloy powders with a particle size of less than 45 μm contain too much oxygen.

Then, the alloy powders were charged in a carbon mold wherein they were heated at a rate of 15° C./min. with the application of a pressure of 500 kgf/cm$^2$ thereto, and hot pressed at 1,050° C. for 20 min. in an argon atmosphere. After removal of the pressure, the product was cooled to obtain a sintered compact.

The outer periphery, and front and back surfaces of the sintered compact were polished off to a depth of 1 mm to obtain a target of 127 mm in diameter and 10 mm in thickness.

This target was found to have a permeability of 2.3, an oxygen content of 550 ppm, and a density of 95% upon sintering. Also, this target was found to be free of cracking or other problems when film was formed at a sputtering target bonding step.

The target was analyzed by use of an scanning electron microscope, X-ray diffractometry, and EPMA. As a result, it was found that a relatively dark region seen as a matrix phase on a scanning electron microphotograph is an $Fe_3Tb$ type crystal phase, and relatively bright zones dispersed in the matrix phase are $Fe_2Tb$ type crystal phases. The proportion of the $Fe_3Tb$ type crystal phase in these crystal phases was 97% by volume. EPMA indicated that the ratio (Fe+Co+Cr):Tb in the $Fe_3Tb$ type crystal phase is approximately 3:1. From this result, it is believed that the Fe sites are replaced by Co and Cr.

FIG. 1 is an X-ray diffraction chart for this target. In FIG. 1, a diffraction peak found between 2θ=41° and 2θ=42° is derived from the $Fe_3Tb$ crystal. It should here be noted that the presence of an α-Fe phase was not detected by X-ray diffractometry.

The homogeneity of the target in its longitudinal, and thickness direction was investigated. In the longitudinal direction, a section was divided into 32 zones, each 20 mm square, to measure their compositions, thereby determining a Tb content variation among the zones. In the thickness direction, a section was divided every 1 mm thickness into 10 zones to measure their compositions, thereby determining a Tb content variation among the zones. As a result, the Tb contents of the 32 zones in the longitudinal direction were within the range of 24.864 to 25.085 at %, and the Tb contents of the 10 zones in the thickness direction were within the range of 24.847 to 25.080 at %. In other words, the Tb contents were all within the range of 25.0±0.2 at %, indicating that the target was greatly homogeneous. Fe, Co and Cr, too, were found to give equivalent results as measured in like manners.

By magnetron sputtering using this target, a magneto-optical recording film was formed on a substrate of 63.5 mm in diameter to prepare a minidisk. In this run, 150,000 or more MDs could be produced without making a target replacement. In addition, no composition change was found at all between an initially formed film and a film formed at the end of the run, and the films were all homogeneous in the longitudinal direction.

Example 2

A target was prepared following Example 1 with the exception that the raw material composition was changed to 22 at % Tb, 68 at % Fe, 5 at % Co and 5 at % Cr.

This target was found to have a permeability of 2.5, an oxygen content of 500 ppm, and a density of 96% upon sintering. Also, this target was found to be free of cracking or other problems when film was formed at a sputtering target bonding step.

Figure 2:
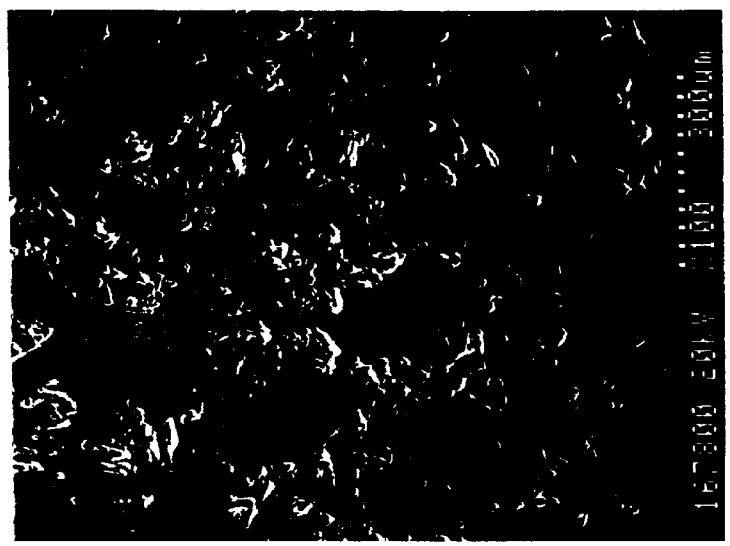
FIG. 2 is a crystal structure-showing substitute photograph for a drawing, i.e., a scanning electron microphotograph of a section through the target of the invention in its longitudinal direction.
Figure 3:
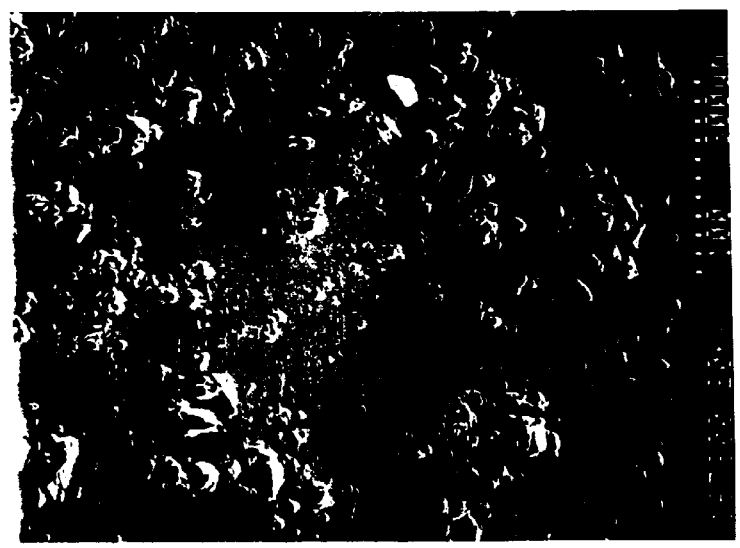
FIG. 3 is a crystal structure-showing substitute photograph for a drawing, i.e., a scanning electron microphotograph of a section through the target of the invention in its thickness direction.

FIG. 2 is a scanning electron microphotograph of a section through the target in the longitudinal direction, and FIG. 3 is a scanning electron microphotograph of a section through the target in the thickness direction. As a result of X-ray diffractometry and EPMA, it was found that a relatively dark region seen as a matrix phase is an $Fe_3Tb$ type crystal phase, and relatively bright zones dispersed in the matrix phase are $Fe_{23}Tb_6$ type crystal phases. The proportion of the $Fe_3Tb$ type crystal phase in these crystal phases was 94% by volume. EPMA indicated that the ratio (Fe+Co+Cr):Tb in the $Fe_3Tb$ type crystal phase is approximately 3:1. From this result, it is believed that the Fe sites are replaced by Co and Cr.

It should here be noted that the presence of an $\alpha$-Fe phase was not detected by X-ray diffractometry.

The homogeneity of the target in its longitudinal, and thickness direction was investigated as in Example 1. As a result, the Tb contents were all within the range of 22.0±0.2 at %, indicating that the target was greatly homogeneous. Fe, Co and Cr, too, were found to give equivalent results as measured in like manners.

By magnetron sputtering using this target, a magneto-optical recording film was formed on a substrate of 63.5 mm in diameter to prepare a minidisk. In this run, 150,000 or more MDs could be produced without making a target replacement. In addition, no composition change was found at all between an initially formed film and a film formed at the end of the run, and the films were all homogeneous in the longitudinal direction.

Comparative Example

For the purpose of comparison, a comparative target was prepared following Example 1 with the exception that an quenched alloy was prepared by making use of arc melting instead of high-frequency melting.

This target was found to have a permeability as high as 5, with the presence of an $\alpha$-Fe phase being detected by X-ray diffractometry, and EPMA.

The homogeneity of the comparative target in its longitudinal and thickness directions, too, was examined as in Example 1. As a result, it was found that some of the Tb contents of the zones divided in the thickness direction deviate from the range of 24 to 26 at %, indicating that the Tb contents vary largely. This was probably because of the formation of an $\alpha$-Fe phase by arc melting. Since the $\alpha$-Fe phase is less susceptible to pulverization, Fe-enriched powders of increased diameter are formed during pulverization, and settle down on a lower portion of a mold upon charged therein for molding under pressure.

To use this comparative target for magnetron sputtering thereby achieving leakage flux strength equivalent to that of the invented target of 10 mm in thickness, the comparative target had to be as thin as 6 mm.

Example 3

The target used in Example 1 for the production of 150,000 MDs was pulverized into the alloy powders to be regenerated.

Apart from this, alloy powders were obtained following Example 1 with the exception that the raw material composition was changed to 26 at % Tb, 64.2 at % Fe, 4.9 at % Co and 4.9 at % Cr, and then classified as in Example 1 to obtain new alloy powders.

The alloy powders to be regenerated and the new alloy powders were mixed together at a weight ratio of 1:1 to obtain a mixture. The mixture was hot pressed as in Example 1, and then polished to prepare a target.

This target was used for MDs production. As in Example 1, no composition change was found at all between an initially formed film and a film formed at the end of the run, and the films were all homogeneous in the longitudinal direction.

Japanese Patent Application No. 70612/1997 is herein incorporated by reference.

Although some preferred embodiments have been described, many modifications and variations may be made thereto in the light of the above teachings. It is therefore to be understood that within the scope of the appended claims, the invention may be practiced otherwise than as specifically described.

What I claim is:

1. An alloy target used to form a magneto-optical recording layer by a magnetron sputtering technique, which comprises 20 to 30 at % of at least one rare earth metal element selected from the group consisting of terbium, dysprosium, gadolinium, samarium, neodymium, holmium, thulium and erbium with a substantial balance of a transition metal element necessarily including at least one element selected from the group consisting of iron, cobalt and nickel, and has a substantially homogeneous sintered structure in sheet form having a thickness of at least 8 mm and a permeability of up to 3.

2. The alloy target according to claim 1, wherein said transition metal element further includes chromium.

3. The alloy target according to claim 1, which has an oxygen content of up to 1,000 ppm.

4. The alloy target according to claim 1, wherein an $Fe_3Tb$ type crystal phase accounts for at least 90% of all crystal phases.

5. A process of fabricating an alloy target as recited in claim 1, which comprises steps of:

blending together said rare earth metal element and said transition metal element in such a way that R/(R+T)=20 to 30 at % where R is said rare earth metal element and T is said transition metal element, thereby obtaining a blend, melting said blend in a high-frequency furnace or crucible furnace to obtain a melt and then quenching said melt to obtain a quenched alloy, mechanically pulverizing said quenched alloy in a non-oxidizing atmosphere to obtain alloy powders, and firing under pressure said alloy powders in an inert gas atmosphere or in vacuum, thereby sintering said alloy powders.

6. The process according to claim 5, wherein at least 90% by weight of said alloy powders has a particle diameter of 45 to 425 μm.

7. A process of regenerating an alloy target as recited in claim 1 after said alloy target has been used up, which comprises:
   a first stage of mechanically pulverizing said used-up alloy target in a non-oxidizing atmosphere to obtain alloy powders to be regenerated,
   a second stage comprising steps of blending together said rare earth metal element and said transition metal element to obtain a blend, melting said blend in a high-frequency furnace or crucible furnace to obtain a melt and then quenching said melt to obtain an quenched alloy, and mechanically pulverizing said quenched alloy in a non- oxidizing atmosphere to obtain alloy powders, and
   a third stage comprising steps of mixing said alloy powders obtained at said second stage with said alloy powders obtained at said first stage to obtain a mixture and firing under pressure said mixture in an inert gas atmosphere or in vacuum thereby sintering said mixture.

8. The process according to claim 7, wherein $R/(R+T)$ in said blend obtained at said second stage is larger than $R/(R+T)$ in said alloy powders obtained at said first stage by a factor of 1.02 to 1.08, where R is said rare earth metal element and T is said transition metal element.

9. An alloy target as claimed in claim 1, wherein the magneto-optical recording layer has an oxygen content of up to 1,000 ppm.

* * * * *